(12) United States Patent
Ju et al.

(10) Patent No.: US 10,148,024 B2
(45) Date of Patent: Dec. 4, 2018

(54) ELECTRICAL CONNECTOR WITH DUAL ELECTRICAL PATH

(71) Applicant: LOTES CO., LTD, Keelung (TW)

(72) Inventors: Ted Ju, Keelung (TW); Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/866,873

(22) Filed: Jan. 10, 2018

(65) Prior Publication Data

US 2018/0198219 A1 Jul. 12, 2018

Related U.S. Application Data

(60) Provisional application No. 62/445,396, filed on Jan. 12, 2017.

(30) Foreign Application Priority Data

Aug. 7, 2017 (CN) .......................... 2017 1 0665702

(51) Int. Cl.
*H01R 12/57* (2011.01)
*H01R 12/71* (2011.01)
(Continued)

(52) U.S. Cl.
CPC ............ *H01R 12/57* (2013.01); *H01R 12/52* (2013.01); *H01R 12/7082* (2013.01);
(Continued)

(58) Field of Classification Search
CPC ...... H01R 12/716; H01R 12/57; H01R 12/52; H01R 12/714; H01R 12/718;
(Continued)

(56) References Cited

U.S. PATENT DOCUMENTS

| 5,984,693 A | 11/1999 | McHugh et al. |
| 7,791,443 B1 * | 9/2010 | Ju ........................ H01R 12/52 336/107 |

(Continued)

FOREIGN PATENT DOCUMENTS

| CN | 2575888 Y | 9/2003 |
| CN | 2736972 Y | 10/2005 |
| CN | 201708296 U | 1/2011 |

*Primary Examiner* — Harshad C Patel
(74) *Attorney, Agent, or Firm* — Locke Lord LLP; Tim Tingkang Xia, Esq.

(57) ABSTRACT

An electrical connector is used for electrically connecting a chip module to a circuit board, and includes a body for upward supporting the chip module. The body is provided with multiple accommodating holes. Multiple terminals are respectively accommodated in the accommodating holes correspondingly. Each terminal is provided with at least one soldering portion in contact with a solder and being soldered to the circuit board. A first portion and a second portion are formed by extending upward from the at least one soldering portion and are located at two opposite sides of the solder. An elastic arm bends upward and extends from the second portion for abutting the chip module. When the chip module presses the elastic arm downward, the elastic arm abuts the first portion. Therefore, two conductive paths are formed in parallel to each other.

20 Claims, 14 Drawing Sheets

(51) Int. Cl.
*H01R 13/24* (2006.01)
*H01R 12/52* (2011.01)
*H01R 13/11* (2006.01)
*H05K 3/34* (2006.01)
*H01R 13/6461* (2011.01)
*H01R 12/70* (2011.01)
*H05K 7/10* (2006.01)
*H01R 13/41* (2006.01)

(52) U.S. Cl.
CPC ......... *H01R 12/716* (2013.01); *H01R 12/718* (2013.01); *H01R 13/112* (2013.01); *H01R 13/2442* (2013.01); *H01R 13/2457* (2013.01); *H01R 13/2464* (2013.01); *H01R 13/6461* (2013.01); *H05K 3/3436* (2013.01); *H05K 7/1061* (2013.01); *H01R 12/714* (2013.01); *H01R 13/41* (2013.01); *H05K 2201/10325* (2013.01)

(58) Field of Classification Search
CPC .............. H01R 13/112; H01R 13/2457; H01R 13/2464; H01R 13/6461; H01R 13/41; H05K 3/3436; H05K 2201/10325
USPC ...... 439/342, 66, 68, 70, 71, 73, 74, 82, 83, 439/84, 87, 88, 91, 591
See application file for complete search history.

(56) References Cited

U.S. PATENT DOCUMENTS

| | | | |
|---|---|---|---|
| 8,192,206 B1* | 6/2012 | Ju | H01R 12/57 439/66 |
| 9,917,386 B1* | 3/2018 | Ju | H01R 12/52 |
| 2004/0219805 A1* | 11/2004 | Ju | H01R 13/2485 439/66 |
| 2007/0249240 A1* | 10/2007 | Chiang | H05K 3/3426 439/850 |
| 2011/0189898 A1* | 8/2011 | Ju | H01R 24/00 439/660 |
| 2012/0178306 A1* | 7/2012 | Ju | H01R 12/57 439/660 |
| 2012/0196481 A1* | 8/2012 | Ju | H01R 13/6588 439/626 |
| 2013/0095698 A1* | 4/2013 | Ju | H01R 12/714 439/626 |

* cited by examiner

ELECTRICAL CONNECTOR WITH DUAL ELECTRICAL PATH

CROSS-REFERENCE TO RELATED PATENT APPLICATION

This application claims priority to and the benefit of, pursuant to 35 U.S.C. § 119(e), U.S. provisional patent application Ser. No. 62/445,396 filed Jan. 12, 2017. This application also claims priority to and benefit of, under 35 U.S.C. § 119(a), Patent Application No. 201710665702.5 filed in P.R. China on Aug. 7, 2017. The entire contents of the above-identified applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector used for electrically connecting a chip module to a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The Chinese Patent No. CN200420080676.8 discloses an electrical connector for electrically connecting a chip module and a circuit board. The electrical connector includes an insulating body and several terminals accommodated in the insulating body. Each terminal includes an elastic end elastically pressing against the chip module, a soldering end soldered and connected to the circuit board, and a connecting portion connecting the elastic end and the soldering end. After the terminals of the electrical connector are completely installed in the insulating body, the elastic end and the soldering end of each terminal are respectively partially exposed from two opposite surfaces of the insulating body, and are respectively connected to a conductive element of the chip module and a solder ball of the circuit board.

However, the electrical connector at least has the following disadvantages. When in use, the conductive element of the chip module presses against a contact portion of the elastic end, and a soldering portion of the soldering end is soldered to the solder ball of the circuit board, thereby forming a relatively long conductive path passing sequentially through the chip module, the contact portion, the elastic end, the connection portion, the soldering end, the soldering portion, the solder ball, and the circuit board. The self-inductance effect of the conductive path is relatively large, and a total electrical impedance is increased when a current flows through this relatively long conductive path. Currently, telecommunication transmission generally has a relatively high frequency, and a larger self-inductance effect is generated. In this way, due to the increases in the self-inductance effect and the electrical impedance, a normal function of a circuit is affected, and the electrical connection and signal transmission performance between the chip module and the circuit board may also be affected.

Therefore, a heretofore unaddressed need to design a novel electrical connector exists in the art to address the aforementioned deficiencies and inadequacies.

SUMMARY

An objective of the present invention is to provide an electrical connector that provides good electrical conduction and signal transmission performance between a chip module and a circuit board.

To achieve the foregoing objective, the present invention adopts the following technical solutions.

An electrical connector, configured to electrically connect a chip module to a circuit board, including: a body, configured to upward support the chip module, wherein the body is provided with a plurality of accommodating holes; and a plurality of terminals, respectively accommodated in the accommodating holes correspondingly, each of the terminals being provided with at least one soldering portion in contact with a solder and being soldered to the circuit board, wherein a first portion and a second portion are formed by extending upward from the at least one soldering portion and are located at two opposite sides of the solder, and an elastic arm bends upward and extends from the second portion and is configured to abut the chip module, and wherein when the chip module presses the elastic arm downward, the elastic arm abuts the first portion.

In certain embodiments, there are two soldering portions separately formed, and the two soldering portions clamp the solder.

In certain embodiments, the first portion has a flat plate portion and an extending arm bending upward and extending from the flat plate portion and located below the elastic arm, and when the chip module presses the elastic arm downward, the elastic arm abuts the extending arm.

In certain embodiments, the elastic arm first extends from the second portion toward a direction away from a vertical plane on which the second portion is located and then reversely bends and extends beyond a vertical plane on which the flat plate portion is located, the elastic arm is provided with a contact portion configured to abut the chip module upward, and a contact position between the extending arm and the elastic arm and the contact portion are located at a same side of the flat plate portion.

In certain embodiments, the first portion is in a shape of a vertical flat plate, an end of the elastic arm is lower than a top end of the first portion, and a side edge of the elastic arm abuts a side edge of the first portion.

In certain embodiments, a notch is concavely provided at the side edge of the elastic arm and extends to the end of the elastic arm, and the side edge of the first portion abuts the notch.

In certain embodiments, the first portion has a guiding oblique surface extending to a top end of the first portion, so as to guide the elastic arm to abut the first portion.

In certain embodiments, the at least one soldering portion is in a shape of a horizontal flat plate, the solder is soldered to a bottom surface of the at least one soldering portion, the first portion and the second portion are formed by bending upward and extending from two opposite sides of the at least one soldering portion, and each of the first portion and the second portion is in a shape of a vertical flat plate.

In certain embodiments, a base portion is formed by bending and extending from a side of the second portion, a gap is provided between the base portion and the first portion, and the elastic arm passes through the gap and abuts a side of the first portion close to the base portion.

In certain embodiments, the terminal further has a base portion, the first portion and the second portion are formed by bending and extending from two opposite sides of the base portion, and the elastic arm abuts a side of the first portion away from the base portion.

In certain embodiments, there are two soldering portions respectively connected to the first portion and the second portion, and the two soldering portions jointly clamp two opposite sides of the solder.

In certain embodiments, the soldering portion connected to the first portion is provided with a through-hole running through a side edge of the soldering portion close to the base portion, and the through-hole retains the solder.

In certain embodiments, a base portion is formed by bending and extending from a side of the second portion, two barbs are formed at two opposite sides of a bottom end of the base portion, and two protruding blocks project from a side surface of the accommodating hole and are located above the two barbs to limit upward movement of the terminal.

In certain embodiments, the solder is soldered to the barbs.

In certain embodiments, a stopping block projects from a side surface of the accommodating hole and is located above the solder to limit upward movement of the solder, and the first portion and the second portion are located at two opposite sides of the stopping block.

Compared with the related art, the electrical connector according to certain embodiments of the present invention has the following beneficial effect.

The first portion and the second portion are located at two opposite sides of the solder. When the chip module presses the elastic arm downward, the elastic arm abuts the first portion. Therefore, two conductive paths are formed in parallel to each other between the chip module and the circuit board, including one sequentially through the chip module, the elastic arm, the first portion, the soldering portion, the solder, and the circuit board, and the other sequentially through the chip module, the elastic arm, the second portion, the soldering portion, the solder, and the circuit board, so as to reduce the impedance and the self-inductance effect during signal transmission, and provide good electrical conduction and signal transmission performance between the chip module and the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
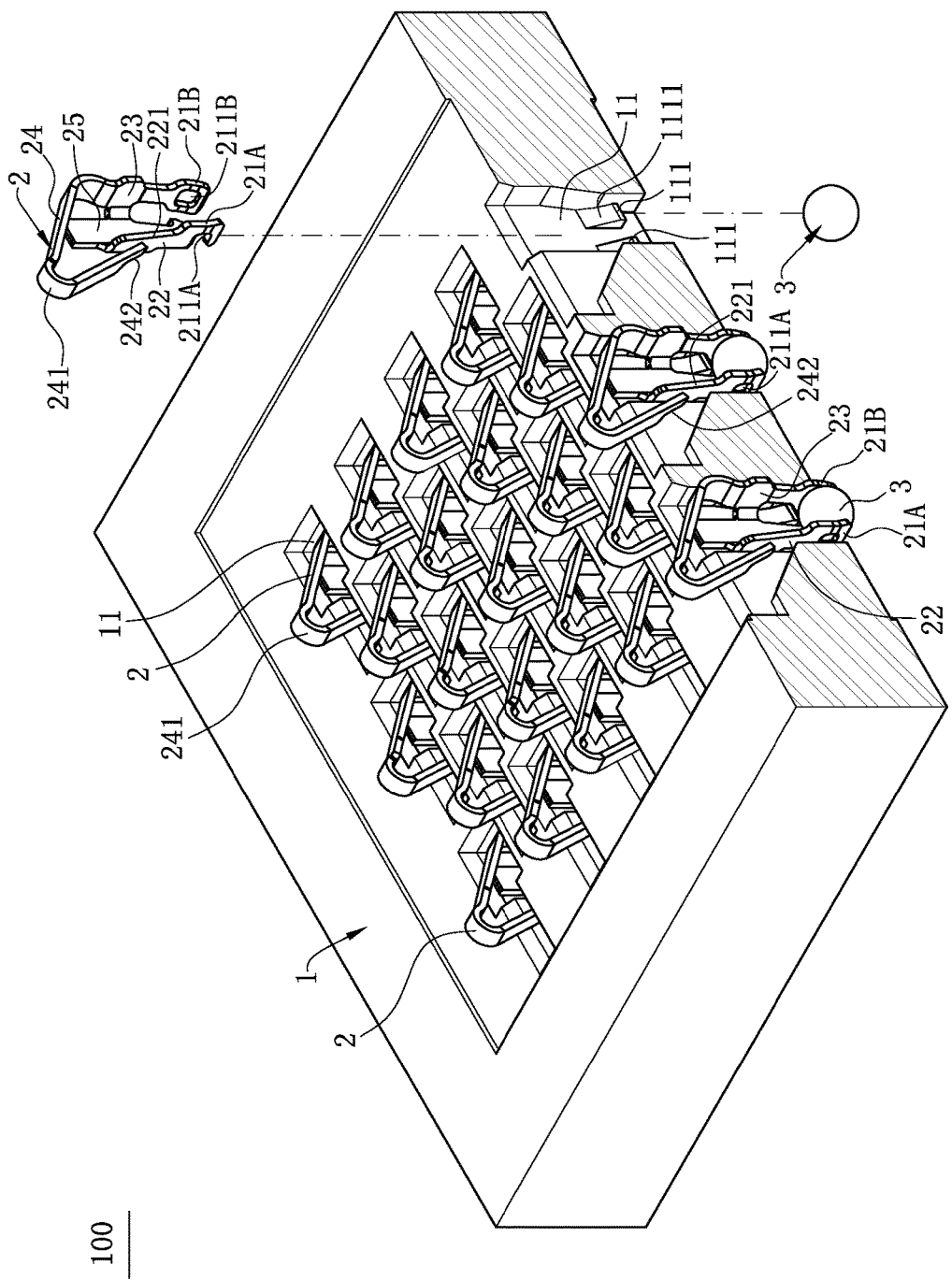
FIG. 1 is a perspective view of an electrical connector according to a first embodiment of the present invention before a chip module is pressed downwards.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-14. In accordance with the purposes of this invention, as embodied and broadly described herein, this invention, in one aspect, relates to an electrical connector.

FIG. 1 to FIG. 6 show an electrical connector 100 according to a first embodiment of the present invention. The electrical connector 100 is configured to electrically connect a chip module 4 to a circuit board 5, and includes a body 1 configured to upward support the chip module 4, and multiple terminals 2 accommodated in the body 1.

Figure 2:
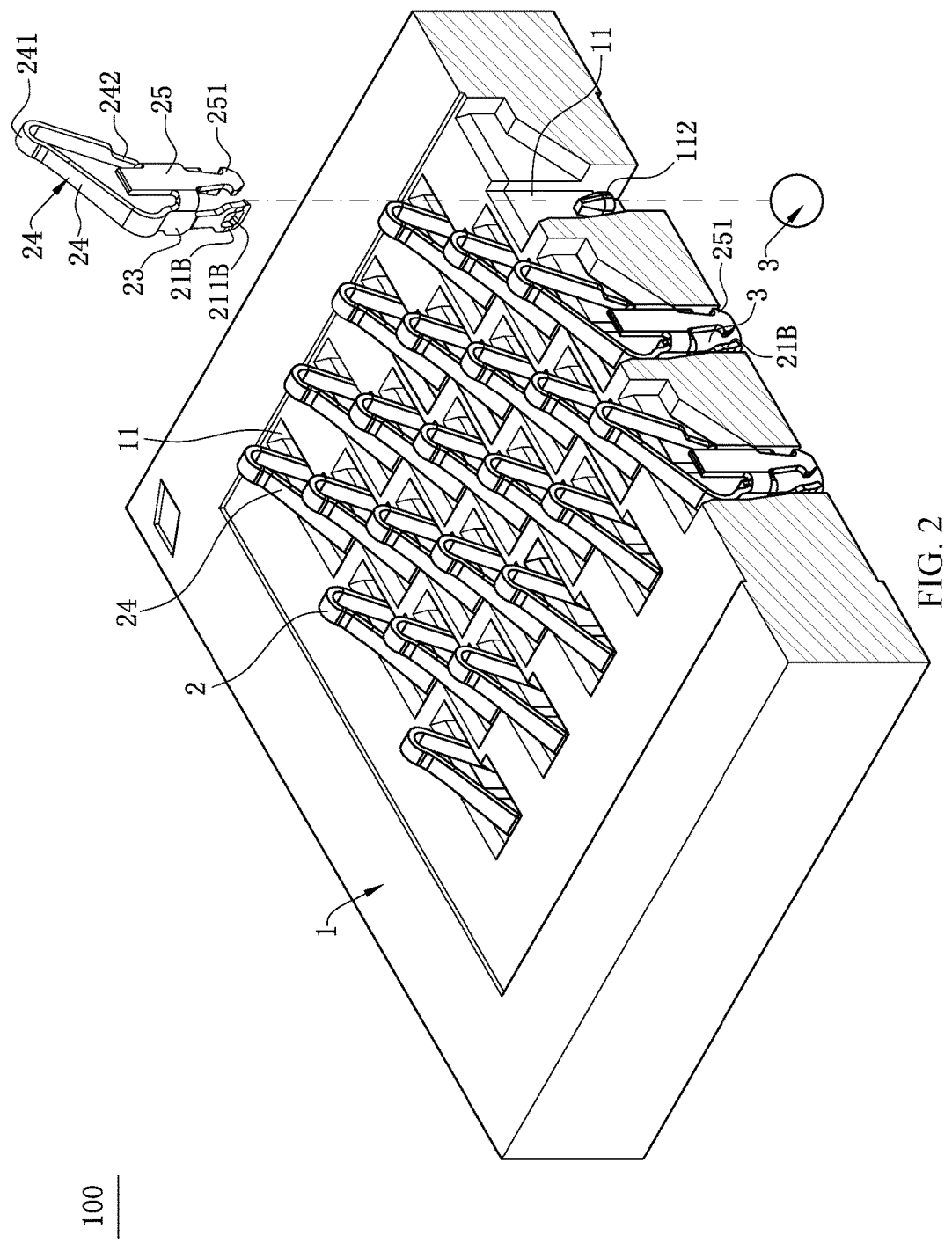
FIG. 2 is a perspective view of the electrical connector in FIG. 1 that horizontally rotates by 180°.

As shown in FIG. 1, the body 1 is provided with multiple accommodating holes 11 which penetrate through the body 1 in a vertical direction, and a side surface of each of the accommodating holes 11 is provided with two protruding blocks 111 disposed at an interval. As shown in FIG. 2, the other opposite side surface of each of the accommodating holes 11 is provided with a stopping block 112 (also referring to FIG. 6).

Figure 3:
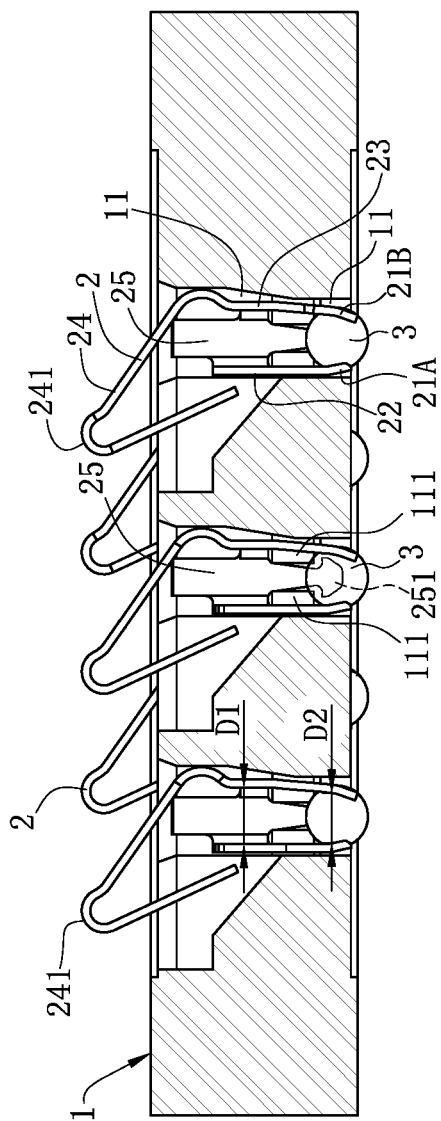
FIG. 3 is a side view of FIG. 1.
Figure 4:
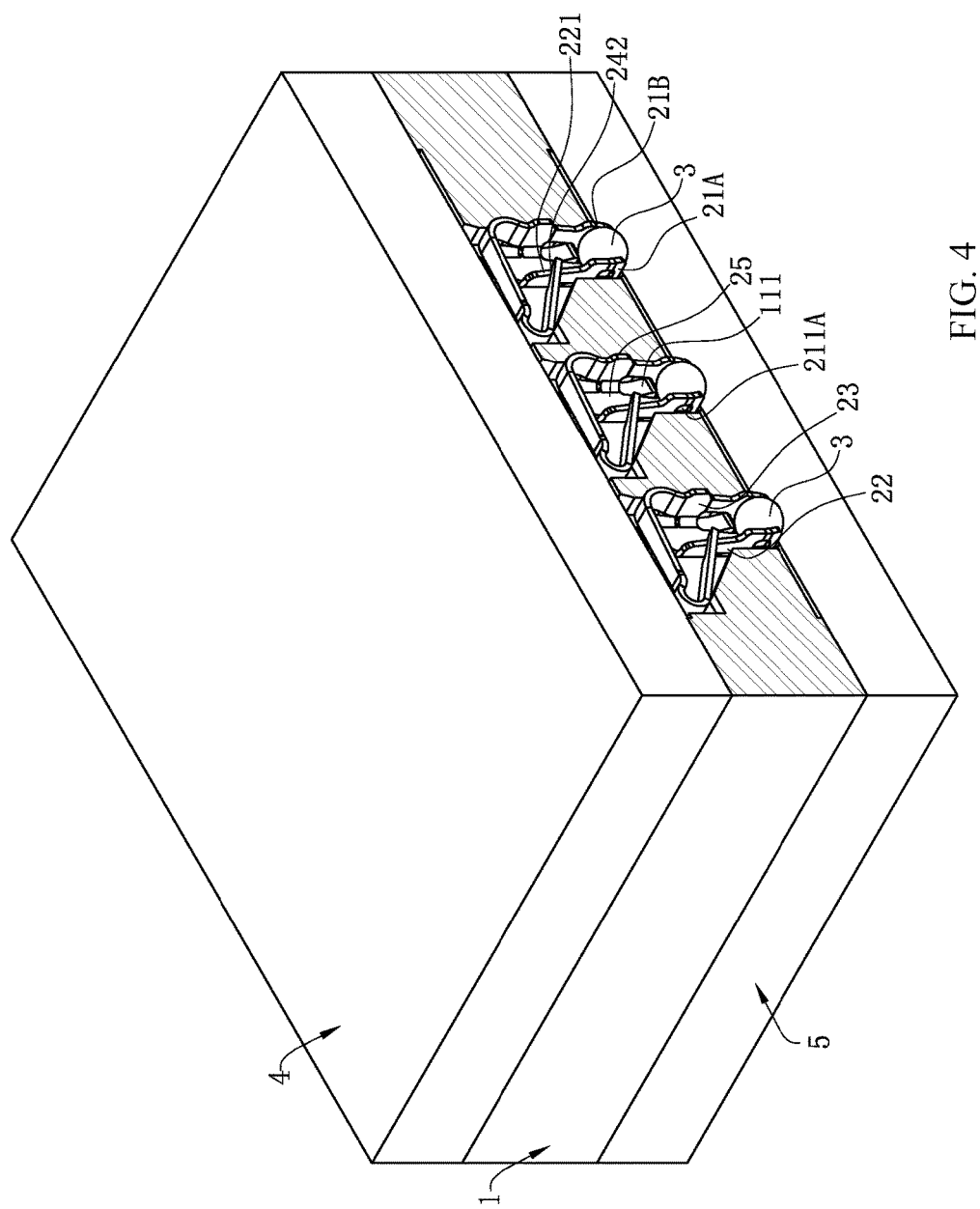
FIG. 4 is a perspective view of the electrical connector in FIG. 1 after the chip module presses downward.

As shown in FIG. 1 and FIG. 3, the terminals 2 are respectively accommodated in the accommodating holes 11 correspondingly. Each of the terminals 2 is provided with a first soldering portion 21A and a second soldering portion 21B opposite to each other. The first soldering portion 21A and the second soldering portion 21B jointly clamp two opposite sides of a solder 3, and the first soldering portion 21A and the second soldering portion 21B are soldered to the circuit board 5 by the solder 3. The first soldering portion 21A is provided with a first through-hole 211A, and the second soldering portion 21B is provided with a second through-hole 211B. The first through-hole 211A and the second through-hole 211B retain the solder 3.

A first portion 22 is formed by extending upward from the first soldering portion 21A, and a second portion 23 is formed by extending upward from the second soldering portion 21B. The first portion 22 and the second portion 23 are located at two opposite sides of the solder 3 and the stopping block 112. Each of the first portion 22 and the second portion 23 is in a shape of a vertical flat plate. A distance D1 between the first portion 22 and the second portion 23 is greater than a distance D2 between the first soldering portion 21A and the second soldering portion 21B, and the first portion 22 has a guiding oblique surface 221 extending to a top end of the first portion 22.

Figure 5:
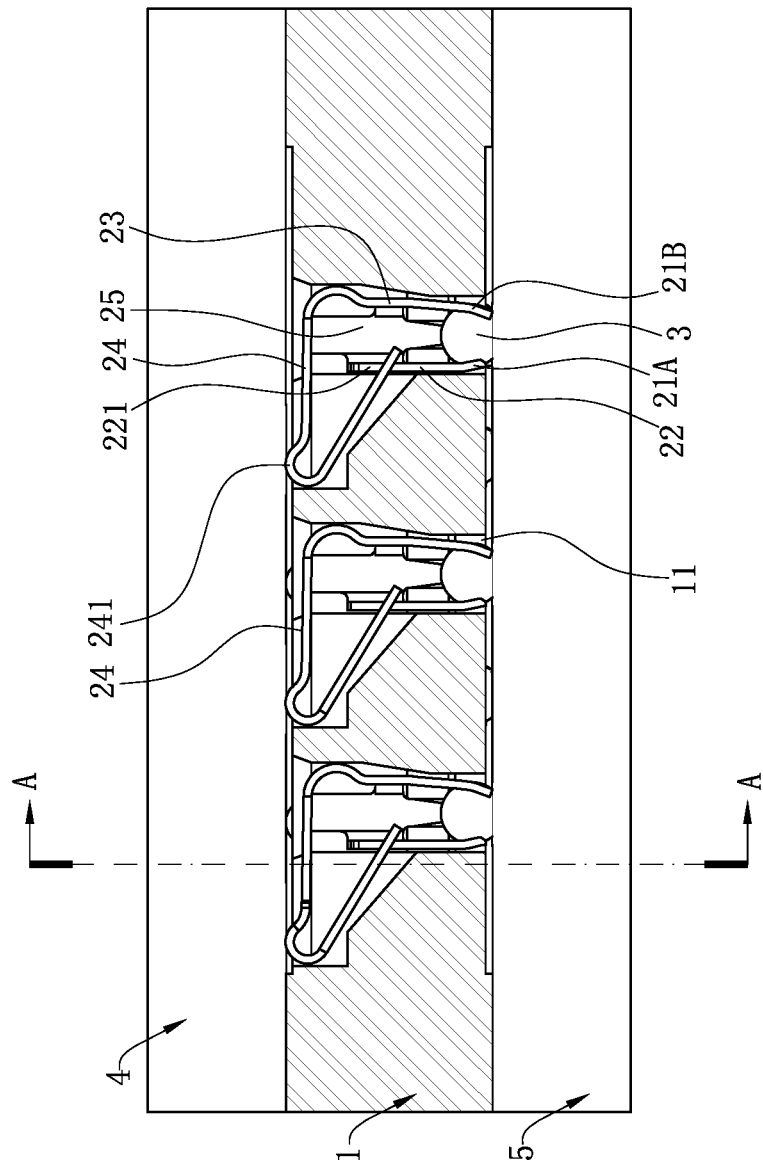
FIG. 5 is a side view of FIG. 4.

As shown in FIG. 1, FIG. 3 and FIG. 5, an elastic arm 24 bends upward and extends from the second portion 23 and is configured to abut the chip module 4. The elastic arm 24 first extends from the second portion 23 toward a direction away from a vertical plane on which the second portion 23 is located, and then reversely bends and extends beyond a vertical plane on which the first portion 22 is located. The elastic arm 24 is provided with an arc-shaped contact portion 241 configured to abut the chip module 4 upward. An end of the elastic arm 24 is lower than a top end of the first portion 22. A notch 242 is concavely provided at a side edge of the elastic arm 24 and extends to an end of the elastic arm 24.

Each of the terminals 2 further has a base portion 25. The first portion 22 and the second portion 23 are formed by bending and extending from two opposite sides of the base portion 25, and the base portion 25 is perpendicular to the first portion 22 and the second portion 23. The guiding oblique surface 221 is located at a side of the first portion 22 away from the base portion 25.

The first through-hole 211A runs through a side edge of the first soldering portion 21A close to the base portion 25, and the second through-hole 211B does not run through a side edge of the second soldering portion 21B. (In other embodiments, the structures of the first through-hole 211A and the second through-hole 211B may be the same.)

Figure 6:
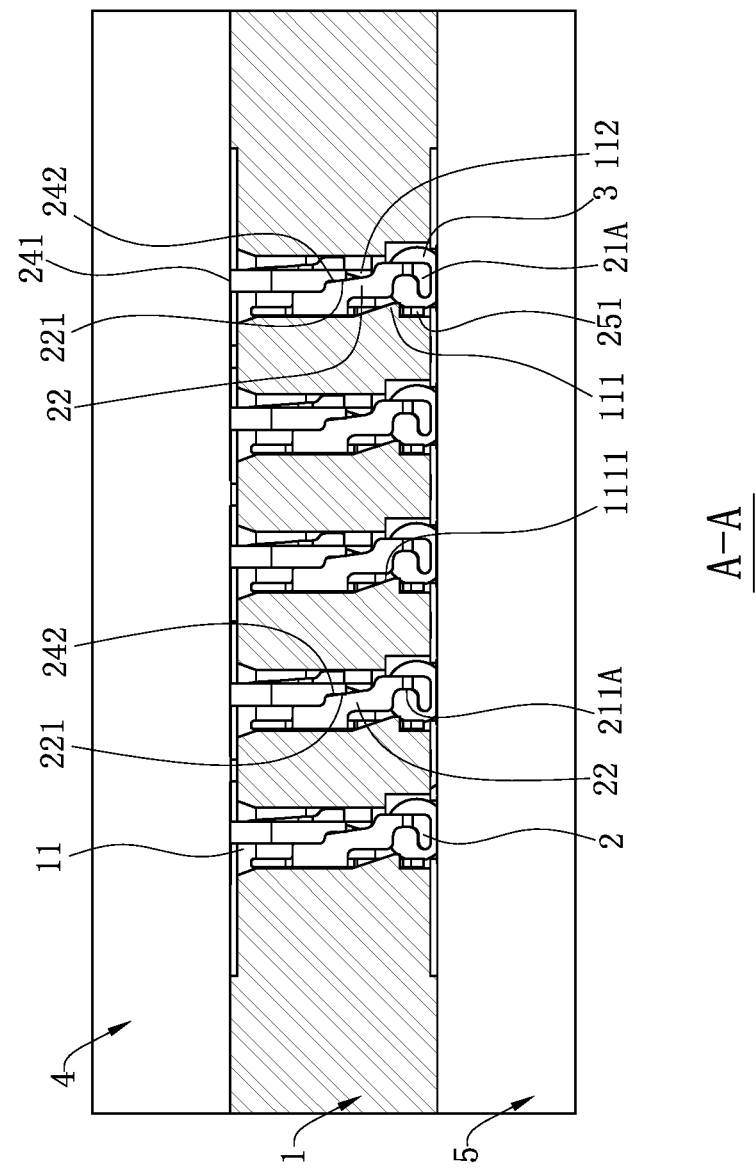
FIG. 6 is a sectional view along a direction A-A in FIG. 5.
Figure 7:
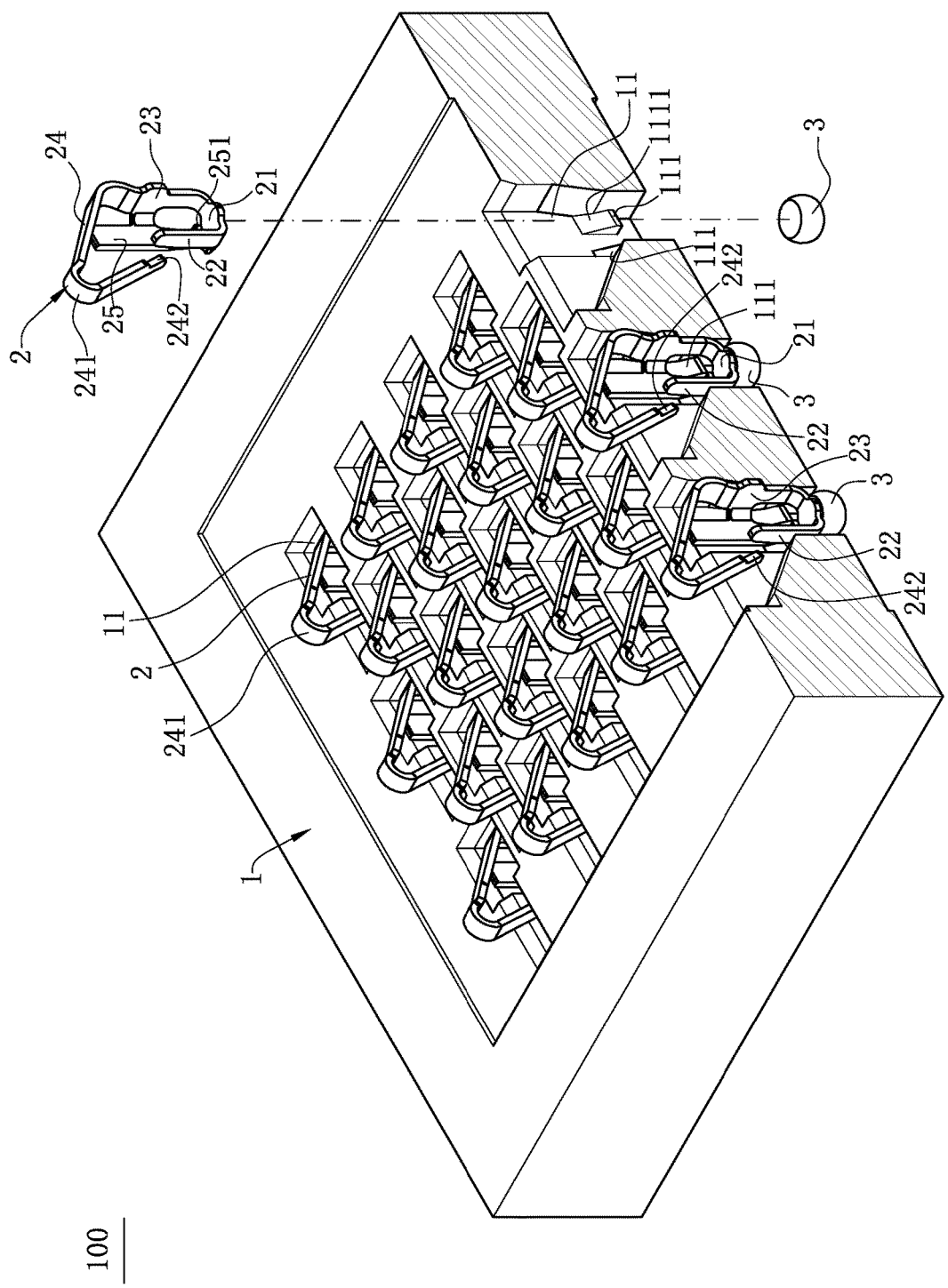
FIG. 7 is a perspective view of an electrical connector according to a second embodiment of the present invention before a chip module presses downward.
Figure 8:
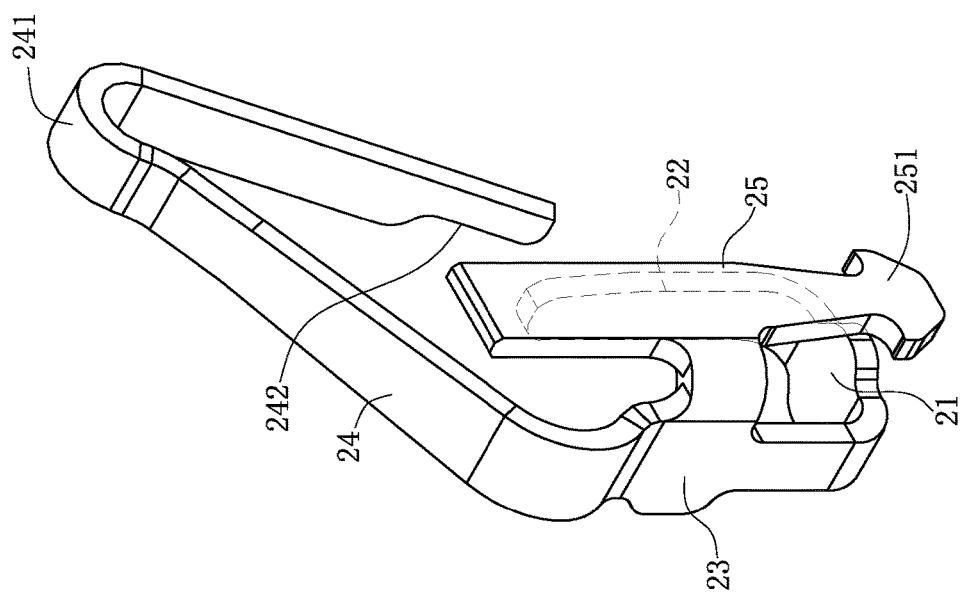
FIG. 8 is a perspective view of a terminal in FIG. 7 that horizontally rotates by 180°.
Figure 9:
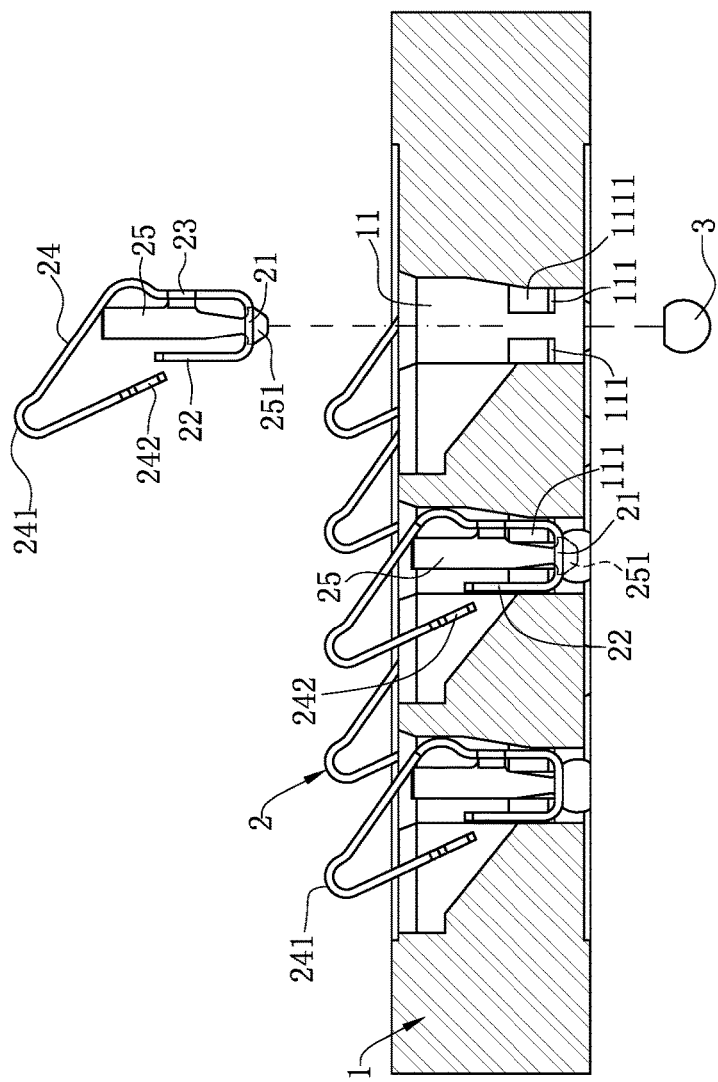
FIG. 9 is a side view of FIG. 7.
Figure 10:
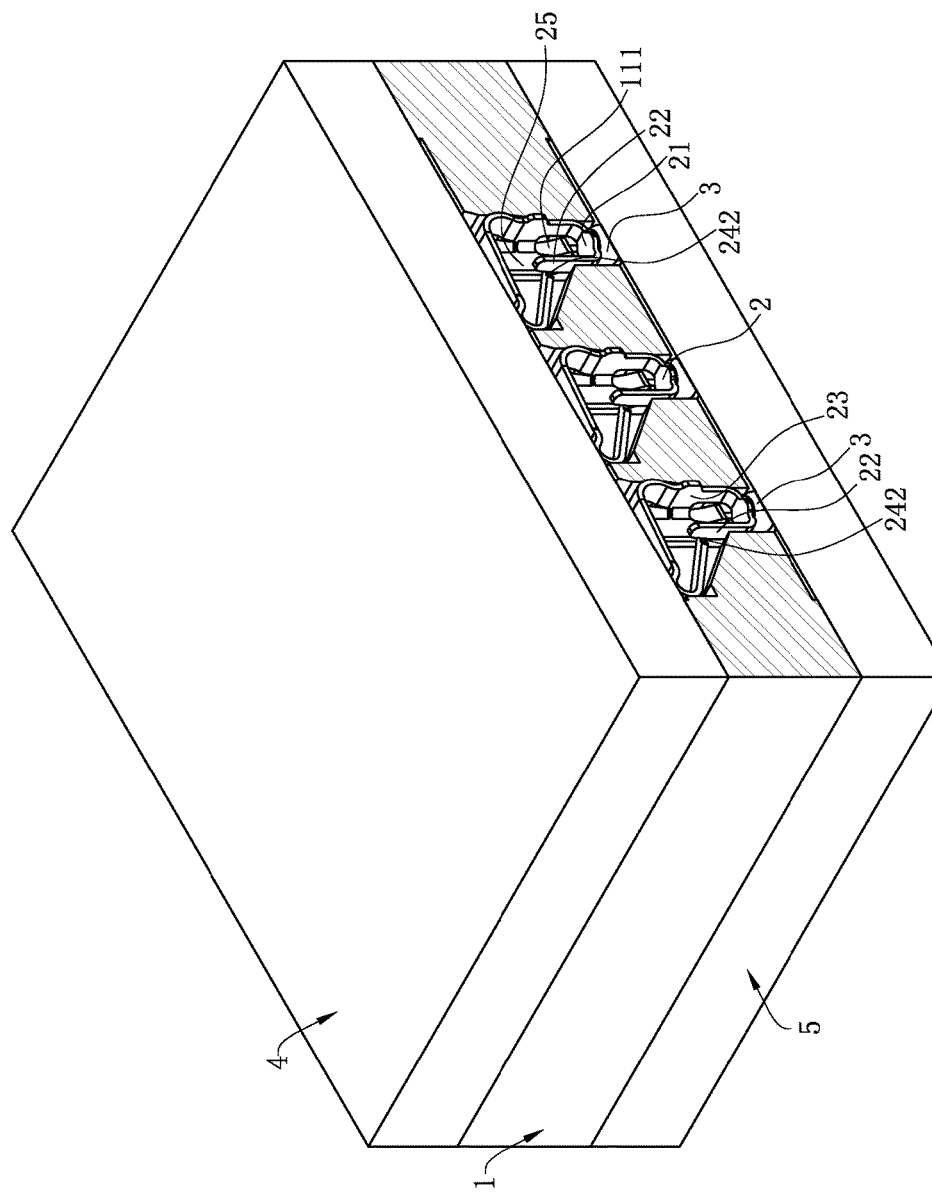
FIG. 10 is a perspective view of the electrical connector in FIG. 7 after the chip module presses downward.
Figure 11:
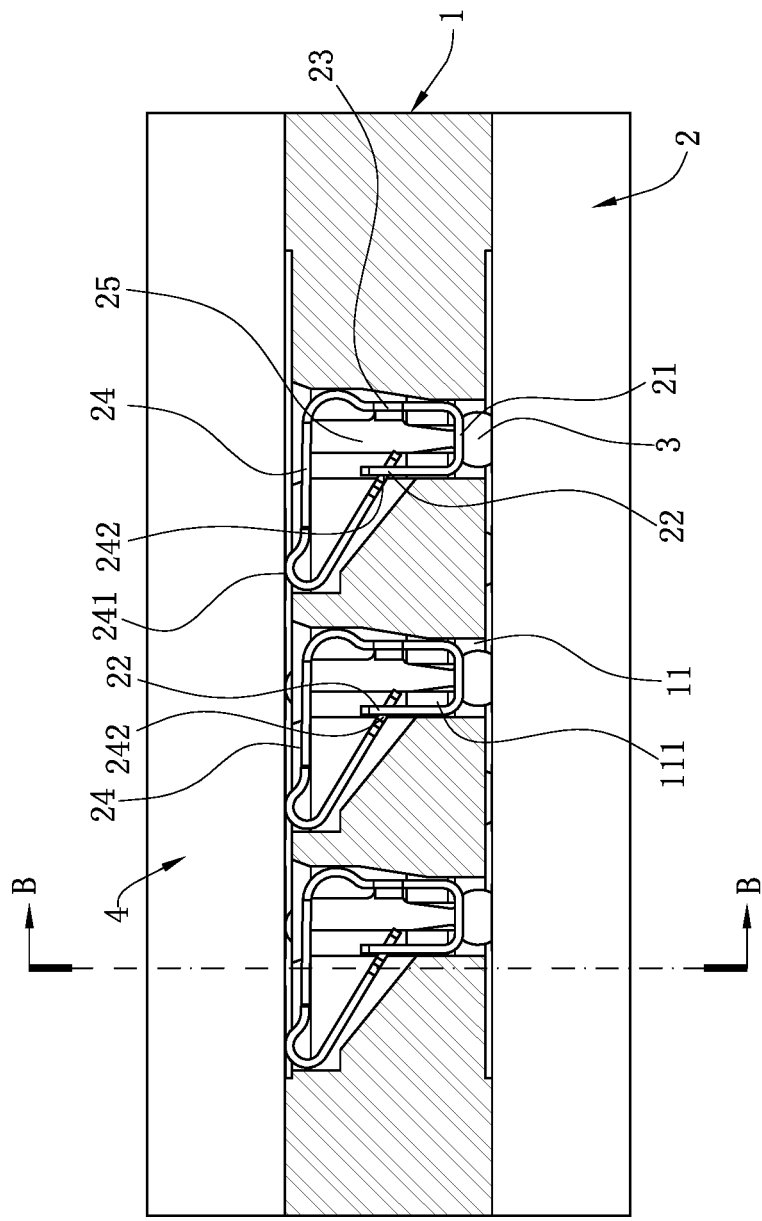
FIG. 11 is a side view of FIG. 10.
Figure 12:
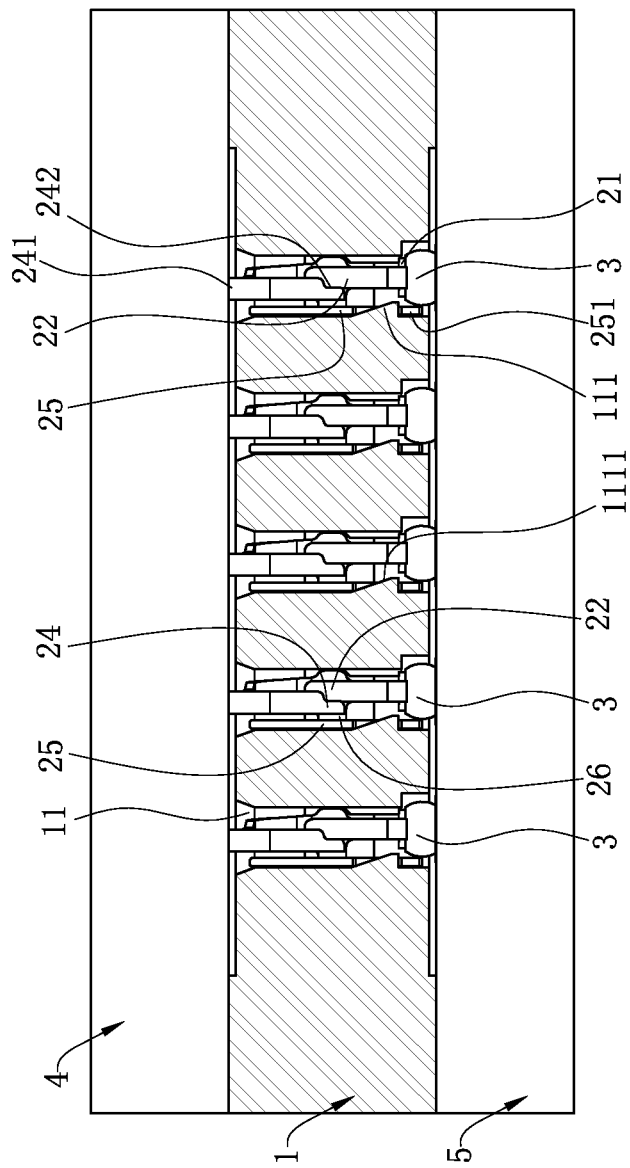
FIG. 12 is a sectional view along a direction B-B in FIG. 11.

As shown in FIG. 1, FIG. 3 and FIG. 6, the two protruding blocks 111 are located at two opposite sides of the base portion 25. Two barbs 251 are formed at two opposite sides of a bottom end of the base portion 25 and are located below the protruding blocks 111 to limit upward movement of the terminal 2. Each of the protruding blocks 111 has a slant surface 1111 configured to guide one of the barbs 251, and the solder 3 is soldered to the barbs 251. A top end of the base portion 25 is configured to connect to a strip, and is lower than a top surface of the accommodating hole 11.

As shown in FIG. 1, during assembly of the electrical connector 100, the terminals 2 are first respectively and correspondingly installed into the accommodating holes 11 downward from the top, until the barbs 251 are located below the protruding blocks 111 (referring to FIG. 6). Then, the solders 3 are respectively installed into the accommodating holes 11 upward from the bottom, until each solder 3 is located between the first soldering portion 21A and the second soldering portion 21B. In this case, the stopping block 112 is located above the solder 3 to limit upward movement of the solder 3, and the barbs 251 are in contact with the solder 3 (referring to FIG. 6).

As shown in FIG. 3, FIG. 5 and FIG. 6, when the chip module 4 presses the elastic arm 24 downward, the elastic arm 24 moves downward, and the elastic arm 24 is guided by the guiding oblique surface 221 to abut the notch 242. (In other embodiments, before the chip module 4 presses downward, the elastic arm 24 may maintain in contact with the first portion 22.) Therefore, at least three conductive paths are formed in parallel to one another between the chip module 4 and the circuit board 5, including one that passes sequentially through the chip module 4, the elastic arm 24, the first portion 22, the first soldering portion 21A, the solder 3, and the circuit board 5; another that passes sequentially through the chip module 4, the elastic arm 24, the first portion 22, the base portion 25, the solder 3, and the circuit board 5; and the other that passes sequentially through the chip module 4, the elastic arm 24, the second portion 23, the second soldering portion 21B, the solder 3, and the circuit board 5, so as to reduce the impedance and self-inductance effect during signal transmission, and provide good electrical conduction and signal transmission performance between the chip module 4 and the circuit board 5.

FIG. 7 to FIG. 12 show an electrical connector 100 according to a second embodiment of the present invention. The second embodiment is different from the first embodiment in that, in this embodiment, each terminal 2 only has one soldering portion 21. The soldering portion 21 is in a shape of a horizontal flat plate. The solder 3 is soldered to a bottom surface of the soldering portion 21. The first portion 22 and the second portion 23 are formed by bending upward and extending from two opposite sides of the soldering portion 21. The base portion 25 is formed by bending and extending from a side of the second portion 23. A gap 26 is provided between the base portion 25 and the first portion 22. The elastic arm 24 passes through the gap 26 and abuts a side of the first portion 22 close to the base portion 25.

Figure 13:
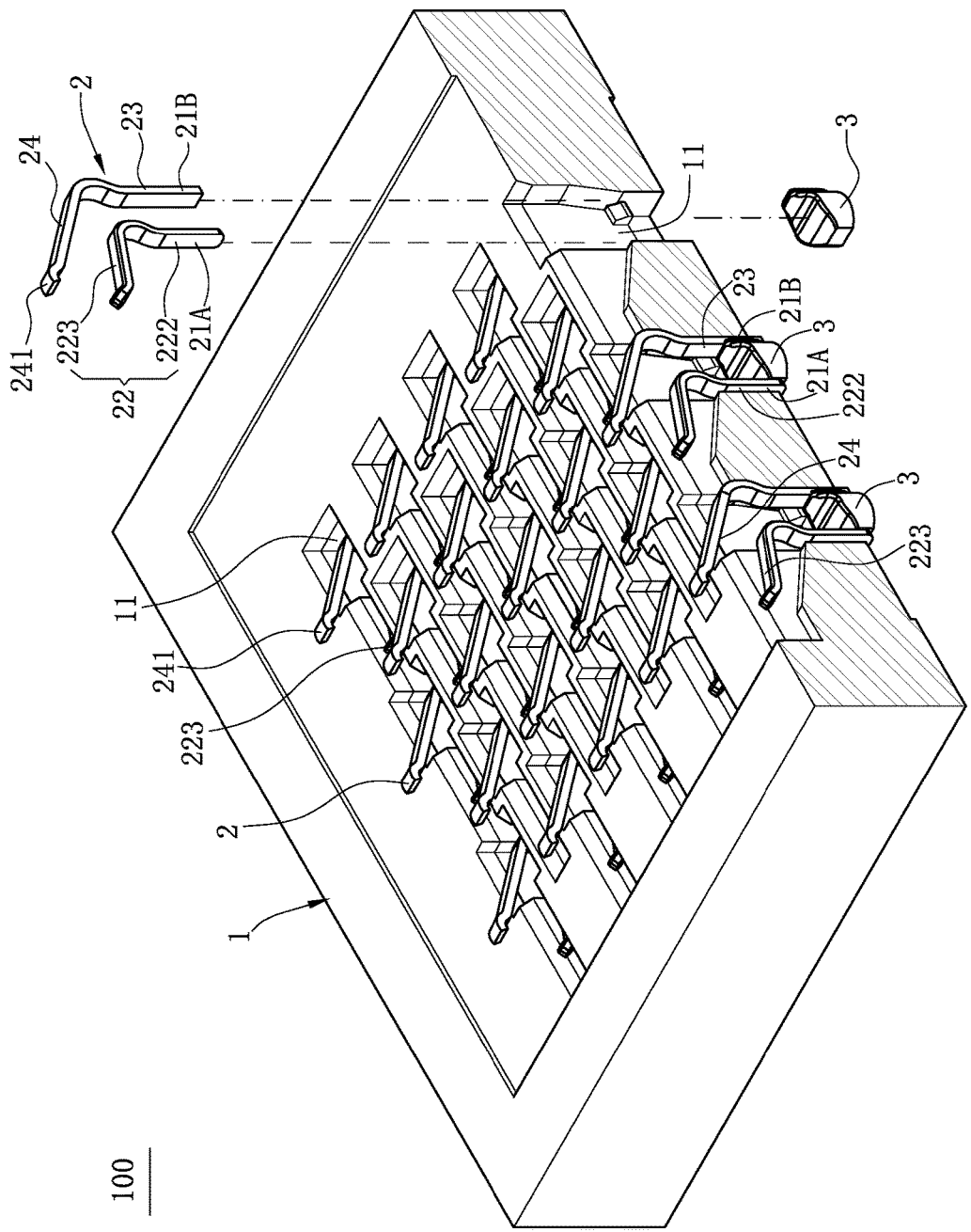
FIG. 13 is a perspective view of an electrical connector according to a third embodiment of the present invention before a chip module presses downward.
Figure 14:
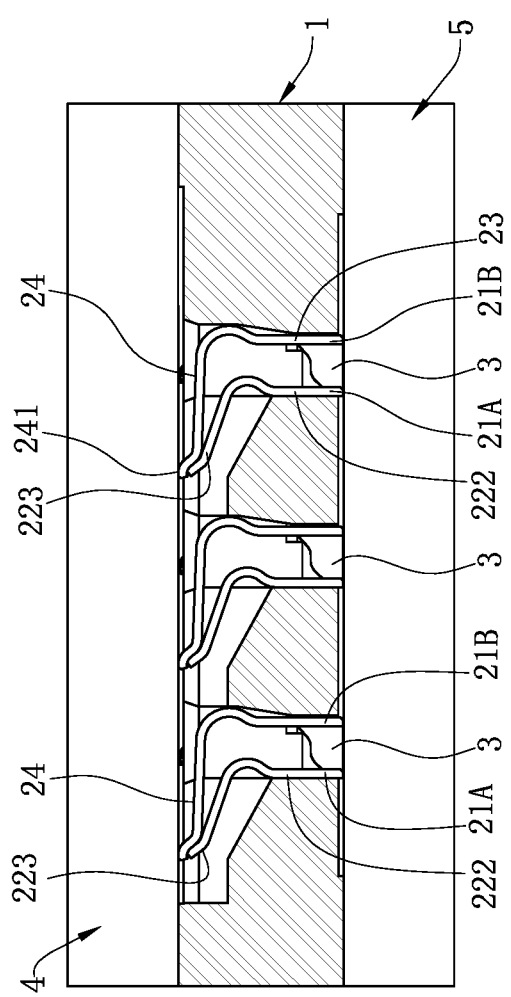
FIG. 14 is a side view of the electrical connector in FIG. 13 after the chip module presses downward.

FIG. 13 and FIG. 14 show an electrical connector 100 according to a third embodiment of the present invention. The third embodiment is different from the first embodiment in that, in this embodiment, the first soldering portion 21A and the second soldering portion 21B are separately formed. The first portion 22 has a flat plate portion 222 and an extending arm 223 bending upward and extending from the flat plate portion 222 and located below the elastic arm 24. When the chip module 4 presses the elastic arm 24 downward, the elastic arm 24 abuts the extending arm 223, so as to ensure stable electrical connection between the elastic arm 24 and the first portion 22, and a contact position between the extending arm 223 and the elastic arm 24 and the contact portion 241 are located at a same side of the flat plate portion 222.

To sum up, the electrical connector according to certain embodiments of the present invention has the following beneficial effects.

(1) The first portion 22 and the second portion 23 are located at two opposite sides of the solder 3. When the chip module 4 presses the elastic arm 24 downward, the elastic arm 24 abuts the first portion 22. Therefore, two conductive paths are formed in parallel to each other between the chip module 4 and the circuit board 5, including one that passes sequentially through the chip module 4, the elastic arm 24, the first portion 22, the first soldering portion 21A, the solder 3, and the circuit board 5, and the other that passes sequentially through the chip module 4, the elastic arm 24, the second portion 23, the second soldering portion 21B, the solder 3, and the circuit board 5, so as to reduce the impedance and the self-inductance effect during signal transmission, and provide good electrical conduction and signal transmission performance between the chip module 4 and the circuit board 5.

(2) When the chip module 4 presses the elastic arm 24 downward, a side edge of the elastic arm 24 abuts a side edge of the first portion 22, and an oxidation layer formed at the elastic arm 24 and the first portion 22 may be removed by scratching, so as to enhance the abutting effect between the elastic arm 24 and the first portion 22.

(3) The two protruding blocks 111 project from a side surface of each accommodating hole 11 and are located at two opposite sides of the base portion 25, and the two barbs 251 are formed at two opposite sides of the bottom end of the base portion 25 and are located below the protruding blocks 111 to limit upward movement of the terminal 2.

(4) The solder 3 is soldered to the barbs 251. When the chip module 4 presses the elastic arm 24 downward, a third conductive path which is in parallel to the other two that passes sequentially through the chip module 4, the elastic arm 24, the first portion 22, the base portion 25, the solder 3, and the circuit board 5 may be formed, so as to further reduce the impedance and self-inductance effect during signal transmission.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to electrically connect a chip module to a circuit board, comprising:
   a body, configured to upward support the chip module, wherein the body is provided with a plurality of accommodating holes; and
   a plurality of terminals, respectively accommodated in the accommodating holes correspondingly, each of the terminals being provided with at least one soldering portion in contact with a solder and being soldered to the circuit board, wherein a first portion and a second portion are formed by extending upward from the at least one soldering portion and are located at two opposite sides of the solder, and an elastic arm bends upward and extends from the second portion and is configured to abut the chip module, and wherein when the chip module presses the elastic arm downward, the elastic arm abuts the first portion,
   wherein the first portion has a flat plate portion and an extending arm bending upward and extending from the flat plate portion and located below the elastic arm, and when the chip module presses the elastic arm downward, the elastic arm abuts the extending arm.

2. The electrical connector according to claim 1, wherein there are two soldering portions separately formed and respectively connected to the first portion and the second portion, and the two soldering portions clamp the solder.

3. The electrical connector according to claim 1, wherein the elastic arm first extends from the second portion toward a direction away from a vertical plane on which the second portion is located and then reversely bends and extends beyond a vertical plane on which the flat plate portion is located, the elastic arm is provided with a contact portion configured to abut the chip module upward, and a contact position between the extending arm and the elastic arm and the contact portion are located at a same side of the flat plate portion.

4. An electrical connector, configured to electrically connect a chip module to a circuit board, comprising:
   a body, configured to upward support the chip module, wherein the body is provided with a plurality of accommodating holes; and
   a plurality of terminals, respectively accommodated in the accommodating holes correspondingly, each of the terminals being provided with at least one soldering portion in contact with a solder and being soldered to the circuit board, wherein a first portion and a second portion are formed by extending upward from the at least one soldering portion and are located at two opposite sides of the solder, and an elastic arm bends upward and extends from the second portion and is configured to abut the chip module, and wherein when the chip module presses the elastic arm downward, the elastic arm abuts the first portion, wherein the first portion has a guiding oblique surface extending to a top end of the first portion, so as to guide the elastic arm to abut the first portion.

5. The electrical connector according to claim 4, wherein the first portion is in a shape of a vertical flat plate, an end of the elastic arm is lower than a top end of the first portion, and a side edge of the elastic arm abuts a side edge of the first portion.

6. The electrical connector according to claim 5, wherein a notch is concavely provided at the side edge of the elastic arm and extends to the end of the elastic arm, and the side edge of the first portion abuts the notch.

7. The electrical connector according to claim 4, wherein the terminal further has a base portion, the first portion and the second portion are formed by bending and extending from two opposite sides of the base portion, and the elastic arm abuts a side of the first portion away from the base portion.

8. The electrical connector according to claim 7, wherein there are two soldering portions respectively connected to the first portion and the second portion, and the two soldering portions jointly clamp two opposite sides of the solder.

9. The electrical connector according to claim 8, wherein the soldering portion connected to the first portion is provided with a through-hole running through a side edge of the soldering portion close to the base portion, and the through-hole retains the solder.

10. An electrical connector, configured to electrically connect a chip module to a circuit board, comprising:
   a body, configured to upward support the chip module, wherein the body is provided with a plurality of accommodating holes; and
   a plurality of terminals, respectively accommodated in the accommodating holes correspondingly, each of the terminals being provided with at least one soldering portion in contact with a solder and being soldered to the circuit board, wherein a first portion and a second portion are formed by extending upward from the at least one soldering portion and are located at two opposite sides of the solder, and an elastic arm bends upward and extends from the second portion and is configured to abut the chip module, and wherein when the chip module presses the elastic arm downward, the elastic arm abuts the first portion,
   wherein a base portion is formed by bending and extending from a side of the second portion, a gap is provided between the base portion and the first portion, and the elastic arm passes through the gap and abuts a side of the first portion close to the base portion.

11. The electrical connector according to claim 10, wherein the at least one soldering portion is in a shape of a horizontal flat plate, the solder is soldered to a bottom surface of the at least one soldering portion, the first portion and the second portion are formed by bending upward and extending from two opposite sides of the at least one soldering portion, and each of the first portion and the second portion is in a shape of a vertical flat plate.

12. The electrical connector according to claim 10, wherein the first portion is in a shape of a vertical flat plate, an end of the elastic arm is lower than a top end of the first portion, and a side edge of the elastic arm abuts a side edge of the first portion.

13. The electrical connector according to claim 12, wherein a notch is concavely provided at the side edge of the elastic arm and extends to the end of the elastic arm, and the side edge of the first portion abuts the notch.

14. An electrical connector, configured to electrically connect a chip module to a circuit board, comprising:
   a body, configured to upward support the chip module, wherein the body is provided with a plurality of accommodating holes; and
   a plurality of terminals, respectively accommodated in the accommodating holes correspondingly, each of the terminals being provided with at least one soldering portion in contact with a solder and being soldered to the circuit board, wherein a first portion and a second portion are formed by extending upward from the at least one soldering portion and are located at two opposite sides of the solder, and an elastic arm bends upward and extends from the second portion and is configured to abut the chip module, and wherein when the chip module presses the elastic arm downward, the elastic arm abuts the first portion,
   wherein a base portion is formed by bending and extending from a side of the second portion, two barbs are formed at two opposite sides of a bottom end of the base portion, and two protruding blocks project from a side surface of the accommodating hole and are located above the two barbs to limit upward movement of the terminal.

15. The electrical connector according to claim 14, wherein the solder is soldered to the barbs.

16. The electrical connector according to claim 14, wherein the first portion is in a shape of a vertical flat plate, an end of the elastic arm is lower than a top end of the first portion, and a side edge of the elastic arm abuts a side edge of the first portion.

17. The electrical connector according to claim 16, wherein a notch is concavely provided at the side edge of the elastic arm and extends to the end of the elastic arm, and the side edge of the first portion abuts the notch.

18. The electrical connector according to claim 14, wherein the terminal further has a base portion, the first portion and the second portion are formed by bending and extending from two opposite sides of the base portion, and the elastic arm abuts a side of the first portion away from the base portion.

19. The electrical connector according to claim 18, wherein there are two soldering portions respectively connected to the first portion and the second portion, and the two soldering portions jointly clamp two opposite sides of the solder.

20. The electrical connector according to claim 19, wherein the soldering portion connected to the first portion is provided with a through-hole running through a side edge of the soldering portion close to the base portion, and the through-hole retains the solder.

* * * * *